(12) United States Patent
Groe

(10) Patent No.: US 7,675,379 B1
(45) Date of Patent: Mar. 9, 2010

(54) LINEAR WIDEBAND PHASE MODULATION SYSTEM

(75) Inventor: John B. Groe, Poway, CA (US)

(73) Assignee: Quintics Holdings, Santa Clara, CA (US)

( * ) Notice: Subject to any disclaimer, the term of this patent is extended or adjusted under 35 U.S.C. 154(b) by 259 days.

(21) Appl. No.: 11/369,897

(22) Filed: Mar. 6, 2006

Related U.S. Application Data

(60) Provisional application No. 60/658,898, filed on Mar. 5, 2005.

(51) Int. Cl.
*H03C 3/00* (2006.01)
(52) U.S. Cl. .................. 332/144; 331/16; 331/175; 375/376; 455/260; 332/117; 332/127
(58) Field of Classification Search .................. 331/16, 331/177 R, 175; 332/127, 128, 117; 455/260; 375/376
See application file for complete search history.

(56) References Cited

U.S. PATENT DOCUMENTS

| | | | |
|---|---|---|---|
| 448,539 A | 3/1891 | Morris | |
| 599,071 A | 2/1898 | Barr | |
| 4,263,560 A | 4/1981 | Ricker | |
| 4,286,237 A * | 8/1981 | James | 332/128 |
| 4,430,627 A | 2/1984 | Machida | |
| 4,706,047 A * | 11/1987 | Avila et al. | 332/117 |
| 4,769,588 A | 9/1988 | Panther | |
| 4,816,772 A | 3/1989 | Klotz | |
| 4,926,135 A | 5/1990 | Voorman | |
| 4,965,531 A | 10/1990 | Riley | |
| 4,994,768 A | 2/1991 | Shepherd et al. | |
| 5,006,818 A | 4/1991 | Koyama et al. | |
| 5,015,968 A | 5/1991 | Podell et al. | |
| 5,030,923 A | 7/1991 | Arai | |
| 5,289,136 A | 2/1994 | DeVeirman et al. | |
| 5,331,292 A | 7/1994 | Worden et al. | |
| 5,399,990 A | 3/1995 | Miyake | |
| 5,491,450 A | 2/1996 | Helms et al. | |
| 5,508,660 A | 4/1996 | Gersbach et al. | |
| 5,548,594 A | 8/1996 | Nakamura | |
| 5,561,385 A | 10/1996 | Choi | |
| 5,581,216 A | 12/1996 | Ruetz | |
| 5,631,587 A | 5/1997 | Co et al. | |
| 5,648,744 A | 7/1997 | Prakash et al. | |
| 5,677,646 A | 10/1997 | Entrikin | |
| 5,739,730 A | 4/1998 | Rotzoll | |
| 5,767,748 A | 6/1998 | Nakao | |
| 5,818,303 A | 10/1998 | Oishi et al. | |
| 5,834,987 A | 11/1998 | Dent | |
| 5,862,465 A | 1/1999 | Ou | |
| 5,878,101 A | 3/1999 | Aisaka | |
| 5,880,631 A | 3/1999 | Sahota | |
| 5,939,922 A | 8/1999 | Umeda | |
| 5,945,855 A | 8/1999 | Momtaz | |
| 5,949,286 A | 9/1999 | Jones | |
| 5,990,740 A | 11/1999 | Groe | |

(Continued)

*Primary Examiner*—Arnold Kinkead
(74) *Attorney, Agent, or Firm*—Blairtech Solution LLC

(57) ABSTRACT

Linear wideband phase modulation system. Apparatus is provided for linear phase modulation utilizing a phase-locked loop. The apparatus includes a limiting circuit that restricts a range of a modulation signal that is coupled to a voltage controlled oscillator (VCO) associated with the phase-locked loop, and a linearizing circuit that reshapes the modulation signal to improve linearity.

29 Claims, 9 Drawing Sheets

U.S. PATENT DOCUMENTS

| | | |
|---|---|---|
| 5,994,959 A | 11/1999 | Ainsworth |
| 5,999,056 A | 12/1999 | Fong |
| 6,011,437 A | 1/2000 | Sutardja et al. |
| 6,018,651 A | 1/2000 | Bruckert et al. |
| 6,044,124 A | 3/2000 | Monahan et al. |
| 6,052,035 A | 4/2000 | Nolan et al. |
| 6,057,739 A | 5/2000 | Crowley et al. |
| 6,060,935 A | 5/2000 | Shulman |
| 6,091,307 A | 7/2000 | Nelson |
| 6,100,767 A | 8/2000 | Sumi |
| 6,114,920 A | 9/2000 | Moon et al. |
| 6,163,207 A | 12/2000 | Kattner et al. |
| 6,173,011 B1 | 1/2001 | Rey et al. |
| 6,191,956 B1 | 2/2001 | Foreman |
| 6,204,728 B1 | 3/2001 | Hageraats |
| 6,211,737 B1 | 4/2001 | Fong |
| 6,229,374 B1 | 5/2001 | Tammone, Jr. |
| 6,234,387 B1 | 5/2001 | Cuthbert et al. |
| 6,246,289 B1 | 6/2001 | Pisati et al. |
| 6,255,889 B1 | 7/2001 | Branson |
| 6,259,321 B1 | 7/2001 | Song et al. |
| 6,288,609 B1 | 9/2001 | Brueske et al. |
| 6,298,093 B1 | 10/2001 | Genrich |
| 6,333,675 B1 | 12/2001 | Saito |
| 6,370,372 B1 | 4/2002 | Molnar et al. |
| 6,392,487 B1 | 5/2002 | Alexanian |
| 6,404,252 B1 | 6/2002 | Wilsch |
| 6,476,660 B1 | 11/2002 | Visocchi et al. |
| 6,515,553 B1 | 2/2003 | Filiol et al. |
| 6,549,078 B1 | 4/2003 | Sridharan et al. |
| 6,559,717 B1 | 5/2003 | Lynn et al. |
| 6,560,448 B1 | 5/2003 | Baldwin et al. |
| 6,571,083 B1 | 5/2003 | Powell, II et al. |
| 6,577,190 B2 | 6/2003 | Kim |
| 6,583,671 B2 | 6/2003 | Chatwin |
| 6,583,675 B2 | 6/2003 | Gomez |
| 6,639,474 B2 | 10/2003 | Asikainen et al. |
| 6,664,865 B2 | 12/2003 | Groe et al. |
| 6,683,509 B2 | 1/2004 | Albon et al. |
| 6,693,977 B2 | 2/2004 | Katayama et al. |
| 6,703,887 B2 | 3/2004 | Groe |
| 6,711,391 B1 | 3/2004 | Walker et al. |
| 6,724,235 B2 | 4/2004 | Costa et al. |
| 6,734,736 B2 | 5/2004 | Gharpurey |
| 6,744,319 B2 | 6/2004 | Kim |
| 6,751,272 B1 | 6/2004 | Burns et al. |
| 6,753,738 B1 | 6/2004 | Baird |
| 6,763,228 B2 | 7/2004 | Prentice et al. |
| 6,774,740 B1 | 8/2004 | Groe |
| 6,777,999 B2 | 8/2004 | Kanou et al. |
| 6,781,425 B2 | 8/2004 | Si |
| 6,795,843 B1 | 9/2004 | Groe |
| 6,798,290 B2 | 9/2004 | Groe et al. |
| 6,801,089 B2 | 10/2004 | Costa et al. |
| 6,845,139 B2 | 1/2005 | Gibbons |
| 6,856,205 B1 | 2/2005 | Groe |
| 6,870,411 B2 | 3/2005 | Shibahara et al. |
| 6,917,719 B2 | 7/2005 | Chadwick |
| 6,940,356 B2 | 9/2005 | McDonald, II et al. |
| 6,943,600 B2 | 9/2005 | Craninckx |
| 6,975,687 B2 | 12/2005 | Jackson et al. |
| 6,985,703 B2 | 1/2006 | Groe et al. |
| 6,990,327 B2 | 1/2006 | Zheng et al. |
| 7,062,248 B2 | 6/2006 | Kuiri |
| 7,065,334 B1 | 6/2006 | Otaka et al. |
| 7,088,979 B1 | 8/2006 | Shenoy et al. |
| 7,123,102 B2 | 10/2006 | Uozumi et al. |
| 7,142,062 B2 | 11/2006 | Vaananen et al. |
| 7,148,764 B2 | 12/2006 | Kasahara et al. |
| 7,171,170 B2 | 1/2007 | Groe et al. |
| 7,215,215 B2 * | 5/2007 | Hirano et al. ............... 332/128 |
| 2002/0031191 A1 | 3/2002 | Shimizu |
| 2002/0071497 A1 | 6/2002 | Bengtsson et al. |
| 2002/0193009 A1 | 12/2002 | Reed |
| 2003/0078016 A1 | 4/2003 | Groe et al. |
| 2003/0092405 A1 | 5/2003 | Groe et al. |
| 2003/0118143 A1 | 6/2003 | Bellaouar et al. |
| 2003/0197564 A1 | 10/2003 | Humphreys et al. |
| 2004/0017852 A1 | 1/2004 | Redman-White et al. |
| 2004/0051590 A1 | 3/2004 | Perrott et al. |
| 2005/0093631 A1 | 5/2005 | Groe |
| 2005/0099232 A1 | 5/2005 | Groe et al. |

* cited by examiner

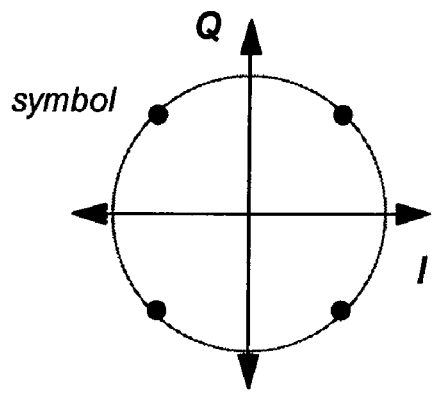
Figure 1
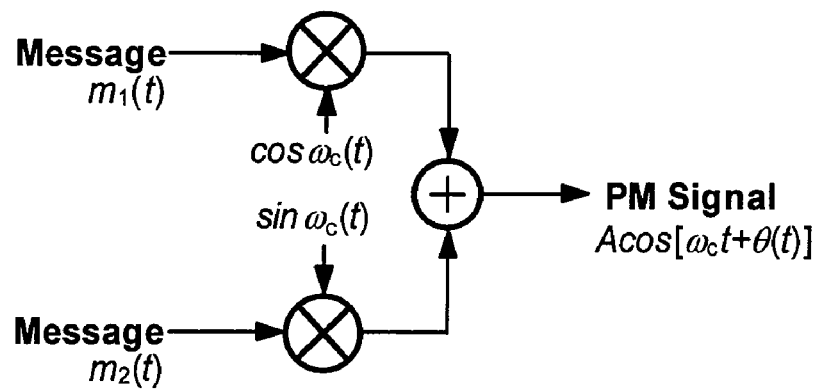
Figure 2 "Prior Art"
— 300
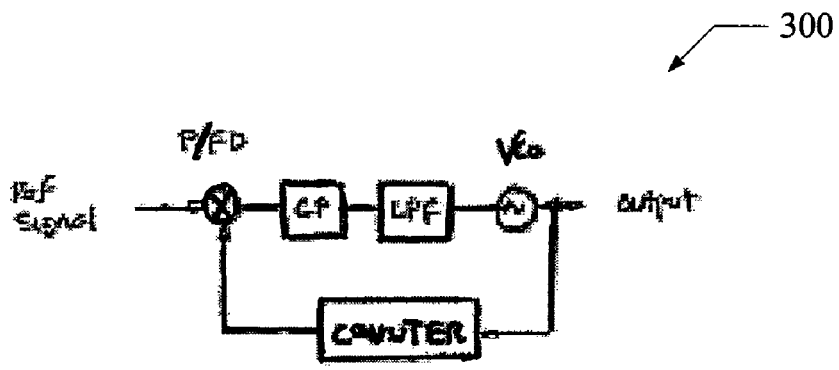
Figure 3

LINEAR WIDEBAND PHASE MODULATION SYSTEM

CROSS REFERENCE TO RELATED APPLICATIONS

This Application claims the benefit of priority from a U.S. Provisional Patent Application entitled "LINEAR WIDEBAND PHASE MODULATION SYSTEM", filed on Mar. 5, 2005 and having application No. 60/658,898, the disclosure of which is incorporated by reference herein in its entirety for all purposes.

FIELD

The present invention relates generally to phase modulators, and more particularly, to a highly linear architecture for direct phase modulation of a phase-locked loop.

BACKGROUND

Phase modulation schemes are very effective and are therefore widely used in communication systems. A simple example of a phase modulation scheme is quaternary phase shift keying (QPSK). FIG. 1 shows a constellation diagram that illustrates how QPSK maps two-bit digital data to one of four phase offsets. FIG. 2 shows a typical QPSK (or I/Q) modulator used to generate a phase-modulated signal. This modulation technique relies on orthogonal signal vectors to realize the phase offsets—an inherently linear technique, since it depends solely on the matching of these orthogonal signals.

The I/Q modulator provides a straightforward approach to generating phase-modulated signals that's also suitable for more complex schemes such as wideband CDMA and OFDM systems. It's also possible to generate the phase-modulated signals using a phase-locked loop—an approach that offers reduced circuitry and lower power consumption. Unfortunately, the performance and bandwidth of typical phase-locked loop architectures is limited.

It would therefore be advantageous to have a low-power, wide-bandwidth, highly linear phase modulator based on a phase-locked loop architecture that overcomes the limitations of conventional systems.

SUMMARY

In one or more embodiments, a very efficient system for wide bandwidth and highly-linear phase modulation is provided. In one embodiment, the system comprises correction and calibration circuitry for direct modulation of a voltage controlled oscillator (VCO) used in a phase-locked loop to synthesize a radio frequency carrier signal.

In one embodiment, an apparatus is provided for linear phase modulation utilizing a phase-locked loop. The apparatus comprises a limiting circuit that restricts a range of a modulation signal that is coupled to a VCO associated with the phase-locked loop, and a linearizing circuit that reshapes the modulation signal to improve linearity.

In one embodiment, a method is provided that operates to provide linear phase modulation utilizing a phase-locked loop having a VCO. The method comprises limiting a range of a modulation signal that is coupled to the VCO, and linearizing the modulation signal input to improve linearity.

In one embodiment, apparatus is provided for linear phase modulation utilizing a phase-locked loop. The apparatus comprises means for limiting that restricts a range of a modulation signal that is coupled to a VCO associated with the phase-locked loop, and means for linearizing that reshapes the modulation signal to improve linearity.

Other aspects of the embodiments will become apparent after review of the hereinafter set forth Brief Description of the Drawings, Description, and the Claims

BRIEF DESCRIPTION OF THE DRAWINGS

The foregoing aspects of the embodiments described herein will become more readily apparent by reference to the following description when taken in conjunction with the accompanying drawings wherein:

FIG. 1 shows a constellation diagram that illustrates how QPSK maps two-bit digital data to one of four offsets;

FIG. 2 shows a diagram of a typical I/Q modulator;

FIG. 3 shows a PLL that operates to synthesize a radio frequency carrier signal;

DESCRIPTION

In one or more embodiments, a very efficient system for wide bandwidth and highly-linear phase modulation is provided. The system is suitable for use with any device that utilizes phase modulation to operate on any type of communication network. For example, the system is suitable for use with mobile telephones, PDAS, email devices, notebook computers, tablet computers, or any other devices that utilizes phase modulation to provide device communications.

FIG. 3 shows one embodiment of a phase-locked loop PLL 300 that operates to synthesize a radio frequency (RF) carrier signal. The PLL 300 comprises a voltage-controlled oscillator (VCO), feedback counter (counter), phase/frequency detector (P/FD), charge pump (CP), and integration filter (LPF).

The PLL 300 uses feedback to minimize the phase difference between a very accurate reference signal (Ref) and the PLL output signal. As such, the PLL 300 produces an output signal at a frequency given by;

$$f_{VCO} = Nf_{REF}$$

where $f_{vco}$ is the frequency of the VCO output signal, N is the value of the feedback counter, and $f_{REF}$ is the frequency of the reference signal.

Figure 4:
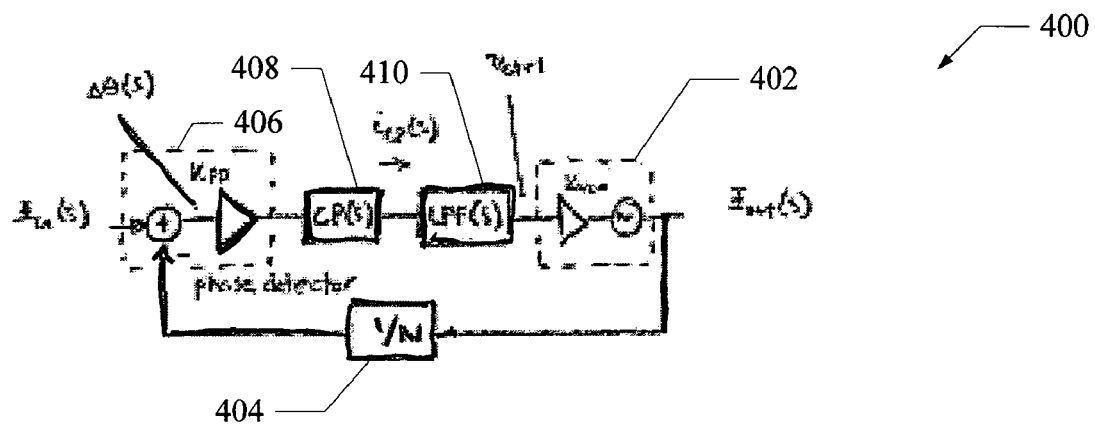
FIG. 4 shows a mathematical model of the PLL shown in FIG. 3.

FIG. 4 shows a mathematical model 400 of the PLL 300 shown in FIG. 3. The voltage-controlled oscillator 402 produces an output signal at a frequency set by the control voltage $v_{ctrl}$ according to the expression;

$$v_{out}(t) = A \cos(\omega_o t + K_{vco} \int v_{ctrl}(t)dt)$$

where $\omega_o$ is the free-running frequency of the oscillator 402 and $K_{vco}$ is its associated gain.

The gain $K_{vco}$ describes the relationship between the excess phase of the carrier $\Phi_{out}(s)$ and the control voltage $v_{ctrl}$, which can be expressed as;

$$\frac{\Phi_{out}(s)}{v_{ctrl}(s)} = \frac{K_{vco}}{s}$$

where $K_{vco}$ is in rads/V. The feedback counter 404 simply divides the output phase $\Phi_{out}$ by N. When the phase-locked loop is locked, the phase detector 406 and charge pump circuit 408 generate a signal $i_{CP}$ that is proportional to the phase difference $\Delta\theta$ between the two signals applied to the phase detector 406. The signal $i_{CP}$ is input to an integration filter 410, which produces the control voltage $v_{ctrl}$. The signal $i_{CP}$ can be expressed as;

$$i_{CP}(s) = K_{pd}\frac{\Delta\theta(s)}{2\pi}$$

where $K_{pd}$ is in A/radians and $\Delta\theta$ is in radians.

Figure 5:
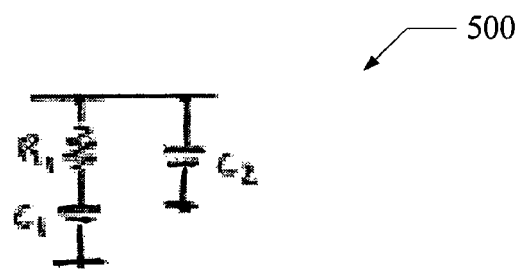
FIG. 5 shows an integration filter.

FIG. 5 shows one embodiment of an integration filter 500. For example, the integration filter 500 is suitable for use as the integration filter 410 shown in FIG. 4. The integration filter 500 comprises resistor R1 and capacitors $C_1$-$C_2$ that operates to transform the signal $i_{CP}$ to the control voltage $v_{ctrl}$ as follows;

$$v_{ctrl}(s) = i_{out}(s)\left(\frac{sR_1C_1 + 1}{s^2R_1C_1C_2 + s(C_1 + C_2)}\right)$$

where a zero (at $1/R_1C_1$) has been added to stabilize the second order system and the capacitor $C_2$ has been included to reduce any ripple on the control voltage.

Referring again to FIG. 4, by combining the above relations a composite open-loop transfer function is obtained that can be expressed as;

$$GH(s) = K_{PD}K_{VCO}\frac{1}{s}\left(\frac{sR_1C_1 + 1}{sR_1C_1C_2 + C_1 + C_2}\right)$$

which has two poles at the origin that are due to the voltage-controlled oscillator 402 and the integration filter 410.

The closed-loop response of the system can be expressed as;

$$T(s) = \frac{NK_{PD}K_{VCO}(sR_1C_1 + 1)}{s^2NR_1C_1C_2 + s[N(C_1 + C_2) + K_{PD}K_{VCO}R_1C_1] + K_{PD}K_{VCO}}$$

which also shows the zero and two complex poles. This system is referred to as a type II phase-locked loop.

The feedback counter 404 has a value N that sets the PLL's output frequency. The digital structure of the counter 404 restricts N to integer numbers, where the number N equals a constant in an integer-N PLL but varies in a fractional-N PLL (to achieve non-integer average values of N).

Figure 6:
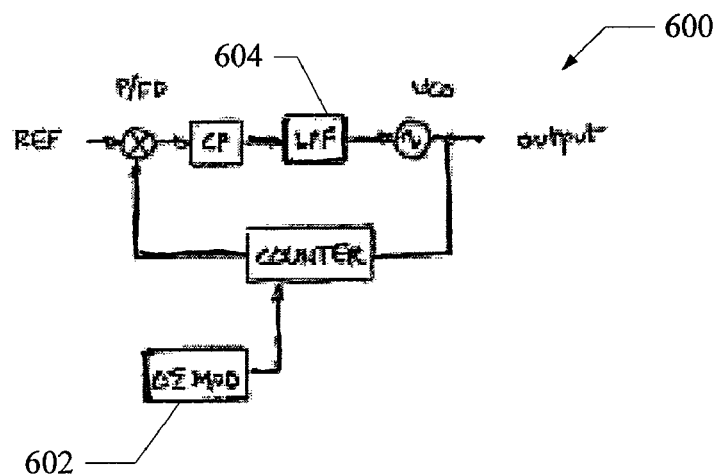
FIG. 6 shows one embodiment of a fractional-N PLL that utilizes a $\Delta\Sigma$ modulator.

FIG. 6 shows one embodiment of a fractional-N PLL 600. The fractional-N PLL 600 comprises a $\Delta\Sigma$ modulator 602 that is used to develop non-integer values of N. The $\Delta\Sigma$ modulator 602 advantageously pushes spurious energy (created by the changing values of the feedback counter) to higher frequencies outside the bandwidth of the PLL's integration filter 604. It can be shown that the effective value of N is simply the average value described by the expression;

$$N = \frac{\sum_{x=1}^{P} N[x]}{P}$$

where N[x] is the sequence of feedback counter values. This expands to the following expression;

$$N[x] = N_{int} + n[x]$$

where $N_{int}$ is the integer part and n[x] is the fractional part of N[x].

The $\Delta\Sigma$ modulator 602 generates the sequence n[x], that satisfies the following expression;

$$\frac{\sum_{x=1}^{P} n[x]}{P} = \frac{k}{M}$$

where k is the input to the $\Delta\Sigma$ modulator with resolution M. In practice, the order of the $\Delta\Sigma$ modulator dictates the range of n[x].

Figure 7:
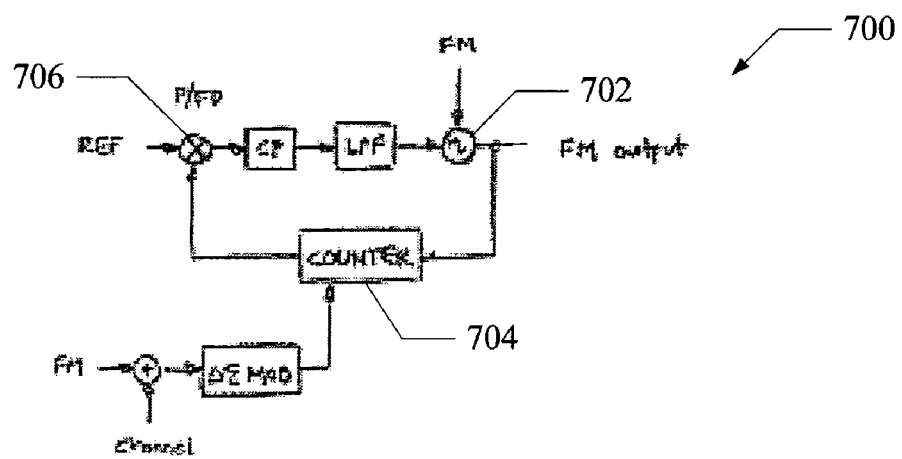
FIG. 7 shows one embodiment of a fractional-N phase-locked loop that supports direct frequency or phase modulation.

FIG. 7 shows one embodiment of a fractional-N phase-locked loop 700 that supports direct frequency or phase modulation. The PLL 700 operates to directly apply a modulation signal (FM) to the VCO 702 and then attenuates its effects at the N counter 704. Preferably, the phase/frequency detector 706 tracks only the RF carrier and not the modulated RF signal. Otherwise, the PLL's negative feedback may act to attenuate the modulation.

Directly applying modulation to the VCO 702 allows for wideband modulation—provided the VCO 702 responds linearly. Thus, this architecture supports direct modulation over the VCO's linear range.

Direct modulation of the VCO 702 controls the oscillator's frequency, not its phase. To realize phase modulation, the modulation signal must be differentiated with;

$$fm(t) = \frac{d}{dt}[pm(t)]$$

This is due to the fundamental relationship;

$$\theta(t) = \int_0^t f(t)\,dt$$

which shows that the frequency integrates over time.

All phase modulation schemes should operate linearly to achieve the required phase shifts (described by the constellation diagram) and thus avoid frequency distortion. This is especially challenging for direct frequency modulation systems because any frequency errors lead to phase errors that accumulate. Consequently, frequency modulation linearity is also important.

Figure 8:
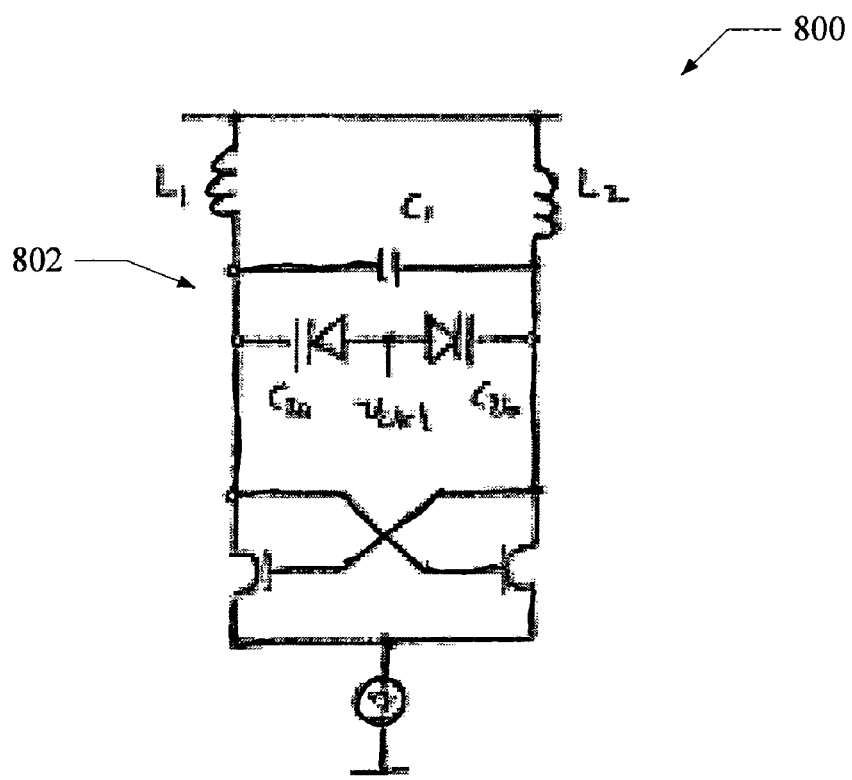
FIG. 8 shows one embodiment of a voltage-controlled oscillator.

FIG. 8 shows one embodiment of a voltage-controlled oscillator 800. The VCO 800 oscillates at a frequency set by the resonance of the LC tank circuit 802 and can be expressed as;

$$f_{osc} = \frac{1}{2\pi\sqrt{(L_1+L_2)C_{eq}}}$$

where $C_{eq}$ is the equivalent shunt capacitance (comprised of capacitor $C_1$ and varactors $C_{2a}$-$C_{2b}$ plus any parasitic capacitance). The equivalent capacitance $C_{eq}$ may also include coarse-tuning capacitors (not shown) to subdivide the tuning range.

The varactor $C_2$ (shown as $C_{2a}$ and $C_{2b}$) allows the VCO— by way of the control signal $v_{ctrl}$—to be tuned to different radio frequencies. It may not however support direct modulation since typical diode varactors behave nonlinearly.

Figure 9:
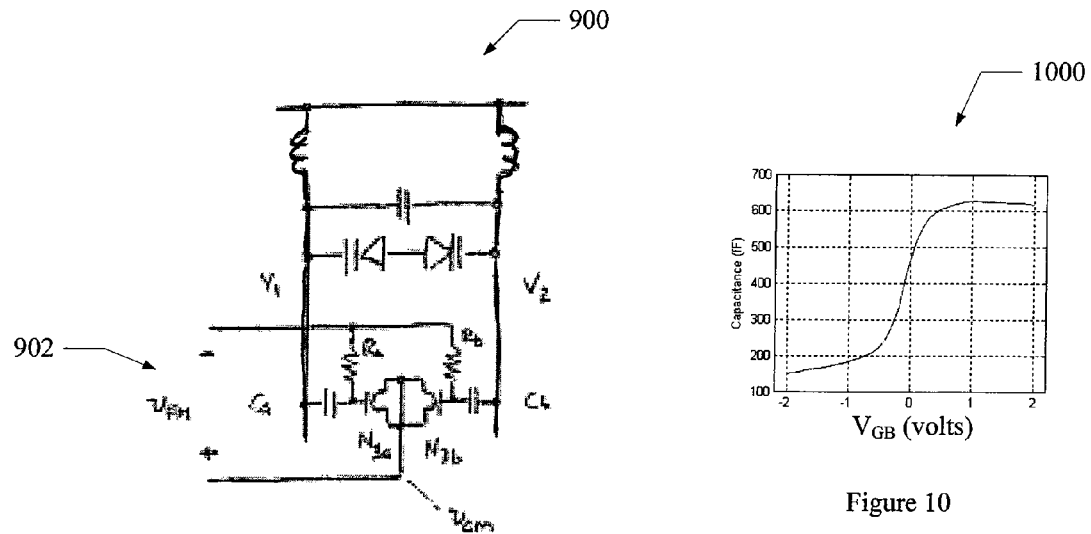
FIG. 9 shows one embodiment of a VCO tank circuit that includes an auxiliary port to support linear phase/frequency modulation.

FIG. 9 shows one embodiment of a VCO tank circuit 900 that includes an auxiliary port 902 to support linear phase/frequency modulation. For example, the tank circuit 900 is suitable for use as the tank circuit 802 shown in FIG. 8. The VCO tank circuit 900 uses the capacitance of accumulation-mode MOSFET devices ($N_{3a}$ and $N_{3b}$) to achieve linear behavior even though these devices display an abrupt response.

Figure 10:
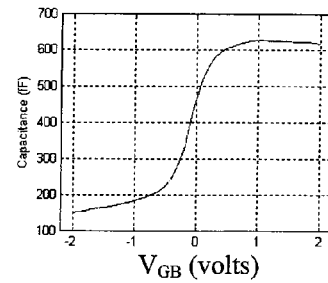
FIG. 10 shows a graph that illustrates the capacitance-voltage relationship for an accumulation-mode MOSFET device.

FIG. 10 shows a graph 1000 that illustrates the capacitance-voltage relationship for an accumulation-mode MOSFET device. The accumulation-mode MOSFET device presents a low capacitance $C_{min}$ at applied gate-to-bulk voltages $V_{GB}$ below the threshold voltage $V_T$ while it displays a high capacitance $C_{max}$ at applied voltages above $V_T$.

Referring again to FIG. 9, capacitors $C_a$ and $C_b$ block the dc level present at the VCO output. Resistors $R_a$ and $R_b$ provide some isolation between the gates of MOSFETs $N_{3a}$ and $N_{3b}$.

The gate-to-bulk voltage $V_{GB}$ applied to each MOSFET device depends on the oscillator's output signal A sin ωt, the modulation signal $v_{FM}$, and the common-mode voltage $v_{cm}$. The symmetric structure of the VCO tank circuit 900 means signals $V_1$ and $V_2$ are differential according to the following;

$$V_1 = A\sin\omega t \quad V_2 = -A\sin\omega t$$

where A is the peak signal of each sinusoidal output and ω is the oscillation frequency. It follows then that;

$$V_{C3a} = A\sin\omega t + v_{FM} - v_{cm} \quad V_{C3a} = -A\sin\omega t + v_{FM} - v_{cm}$$

which describe the gate-to-bulk voltages $V_{GB}$ applied to MOSFET devices $N_{3a}$ and $N_{3b}$. The two MOSFET devices connect back-to-back, so that their individual capacitances behave oppositely.

The modulation signal $v_{FM}$ affects the MOSFET devices as follows. It will be assumed the threshold voltage $V_T$ is set to zero and the common-mode voltage $v_{cm}$ is ac ground. With the modulation signal $v_{FM}$ nulled, each MOSFET capacitor presents its maximum capacitance $C_{max}$ for one-half cycle (of A sin ωt) while the other MOSFET capacitor presents its minimum capacitance $C_{min}$.

Figures 11A, 11B, 11C:
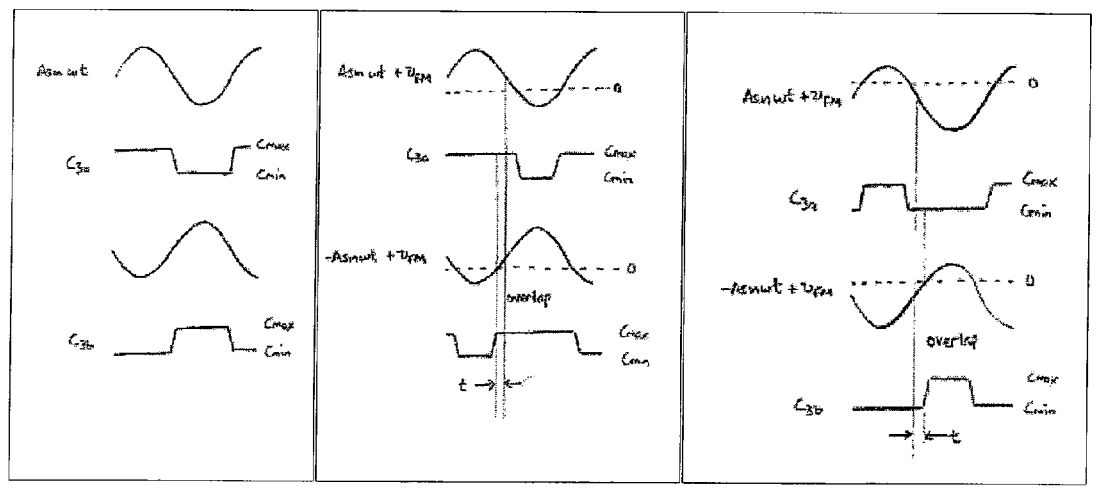
FIGS. 11a-c show graphs that illustrate details about MOSFET devices used as a variable capacitance at different bias levels.

FIG. 11a shows a graph that illustrates the operation of the circuit 900 when the modulation signal $v_{FM}$ is nulled. As a result, the equivalent series capacitance $C_{FM}$ associated with the FM port 902 can be expressed as;

$$C_{mid} = C_{FM}(v_{FM}=0) = \frac{C_{min}C_{max}}{C_{min}+C_{max}}$$

FIG. 11b shows a graph that illustrates the operation of the circuit 900 as the modulation signal $v_{FM}$ moves positive, such that both MOSFET devices spend more time at their maximum capacitance values $C_{max}$. This creates an overlap time (t) that can be approximated by the following expression;

$$t = \frac{1}{\omega}\sin^{-1}\left(-\frac{v_{FM}}{A}\right)$$

During this overlap time, the equivalent series capacitance is $C_{max}/2$. Hence, the back-to-back MOSFET devices present an equivalent series capacitance $C_{FM}$ that varies according to the following;

$$C_{FM} = \begin{vmatrix} \dfrac{C_{max}}{2} & \text{for} & v_{FM} > |A\sin\omega t| + V_T \\ C_{mid} & \text{for} & v_{FM} \leq |A\sin\omega t| + V_T \end{vmatrix}$$

which leads to an average capacitance. It's the average capacitance that adds to $C_{eq}$ in the LC tank and thereby shifts the VCO's frequency of oscillation. This average capacitance levels off at $C_{max}/2$ when $v_{FM}$ exceeds A+VT.

FIG. 11c shows a graph that illustrates the operation of the circuit 900 as the modulation signal $v_{FM}$ moves negative and below the device's threshold voltage $V_T$. As a result, both MOSFET devices spend more time at their minimum value. The overlap time (t) when both MOSFET devices present minimum capacitance is given by the expression;

$$t = \frac{1}{\omega}\sin^{-1}\left(\frac{v_{FM}}{A}\right)$$

It follows that the equivalent series capacitance $C_{FM}$ in this situation is evaluated according to the following;

$$C_{FM} = \begin{vmatrix} \dfrac{C_{min}}{2} & \text{for} & -v_{FM} > |A\sin\omega t| + V_T \\ C_{mid} & \text{for} & -v_{FM} \leq |A\sin\omega t| + V_T \end{vmatrix}$$

as $A \sin \omega t$ changes. This average capacitance levels off at $C_{min}/2$ when $v_{FM}$ is less than $-A+V_T$.

The average capacitance of each MOSFET device is governed by the fundamental expression;

$$i(t) = C\frac{d}{dt}v(t)$$

which describes the instantaneous behavior of a capacitor. This relationship can be rewritten to provide the average capacitance as follows;

$$C_{ave} = \frac{\text{rms}(i)_f}{\text{rms}\left(\dfrac{d}{dt}v(t)\right)_f}$$

where $\text{rms}(\cdot)_f$ is the root-mean-squared value of the argument evaluated at the fundamental or oscillation frequency f. The voltage applied to each MOSFET device can be expressed as;

$$v(t) = A \sin \omega t + v_{FM}$$

and its derivative can be expressed as;

$$\frac{d}{dt}v(t) = A\omega\cos\omega t$$

The root-mean-squared value is defined by the following relation;

$$\text{rms}(x) = \left[\frac{1}{T}\int_0^T x^2 dx\right]^{\frac{1}{2}}$$

and is equal to;

$$\text{rms}\left(\frac{d}{dt}v(t)\right)_f = \frac{A\omega}{\sqrt{2}}$$

for the derivative of the applied voltage. The root-mean-squared value of the capacitor current at the fundamental frequency is the first coefficient of its Fourier series expansion, which can be expressed as;

$$i(t) = a_0 + a_1 \cos \omega t + \ldots a_n \cos n\omega t$$

This is given by the expression;

$$a_1 = \frac{2}{T}\int_0^T i(t)\cos\omega t \, dt$$

where $a_1$ is the peak amplitude. This is ($\sqrt{2}$) larger than the rms value for sinusoidal signals. It follows that;

$$\text{rms}(i)_f = \frac{\sqrt{2}}{T}\int_0^T C[v(t)]\frac{d}{dt}v(t)\cos\omega t \, dt$$

where $C[v(t)]$ represents the capacitance of the MOSFET device with $v(t)$ applied.

After substituting for $dv(t)/dt$ the following expression is obtained.

$$\text{rms}(i)_f = \sqrt{2}\frac{A\omega}{T}\int_0^T C[v(t)]\cos^2\omega t \, dt$$

This results in an average capacitance equal to;

$$C_{ave} = \frac{\text{rms}(i)_f}{\text{rms}\left(\dfrac{d}{dt}v(t)\right)_f} = \frac{2}{T}\int_0^T C[v(t)]\cos^2\omega t \, dt$$

which can be evaluated using numerical integration.

In the above analysis, the common-mode voltage $v_{cm}$ was assumed to be ac ground. This introduces some error as this signal, although small, is actually non-zero. The differential voltage $\Delta V$ (which equals $V_1 - V_2$) applied to the back-to-back MOSFET devices is simply $2A \sin \omega t$ and is independent of each device's capacitance, $C_{3a}$ and $C_{3b}$. It has already been shown that the voltages applied to each individual MOSFET device do not track and their capacitances change oppositely. This affects the common mode voltage $v_{cm}$ according to the expression;

$$v_{cm}(t) = A\sin\omega t - \Delta V\left(\frac{C_{3b}}{C_{3a} + C_{3b}}\right)$$

which simplifies to;

$$v_{cm}(t) = A\sin\omega t - \left[1 - 2\left(\frac{C_{3b}}{C_{3a} + C_{3b}}\right)\right]$$

Note that the bracketed term possesses the same sign as $A \sin \omega t$. This is because $C_{3b} < C_{3a}$ when $\sin \omega t$ is positive and $C_{3b} > C_{3a}$ when $\sin \omega t$ is negative. As a result, the second harmonic of $A \sin \omega t$ appears attenuated at the common-mode point.

Figure 12:
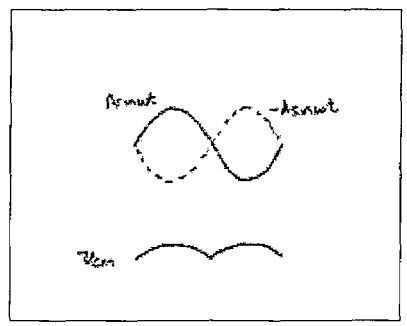
FIG. 12 shows the signal present at the common-mode point of a back-to-back MOSFET devices within a VCO.

FIG. 12 shows a diagram that illustrates how the second harmonic of $A \sin \omega t$ appears attenuated at the common-mode point. This tends to reduce positive values of the modulation signal $v_{FM}$ and expand negative values of the modulation signal.

The above analysis also assumes that capacitors $C_a$ and $C_b$ are greater than $C_{max}$. This allows most of the VCO output signal $2A \sin \omega t$ to appear across MOSFETs $N_{3a}$ and $N_{3b}$. Otherwise; $\Delta V$ would change with the capacitance of the MOSFET devices.

Figure 13A:
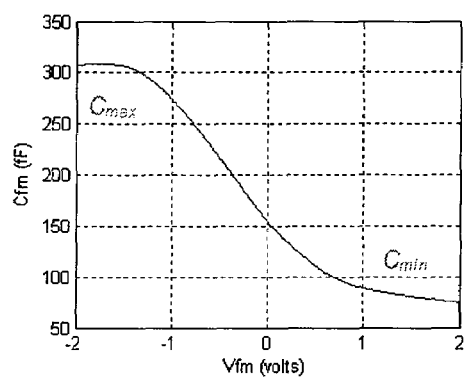
FIGS. 13a-c illustrate the behavior of one embodiment of a VCO.

FIG. 13a shows a graph that illustrates the average capacitance of the back-to-back MOSFET devices $C_{FM}$ for different values of modulation signal $v_{FM}$. As expected, it spans from $C_{min}/2$ to $C_{max}/2$ and equals $C_{mid}$ at zero.

Figure 13B:
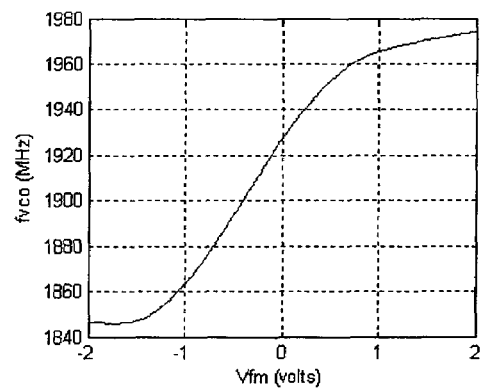

FIG. 13b shows a graph that illustrates a shift in the resonant frequency of the VCO's LC tank circuit due to variable capacitance. The frequency shift appears linear, but its derivative expressed as;

$$K_{FM} = \frac{d}{dv_{FM}} f_{VCO}$$

shows otherwise.

Figure 13C:
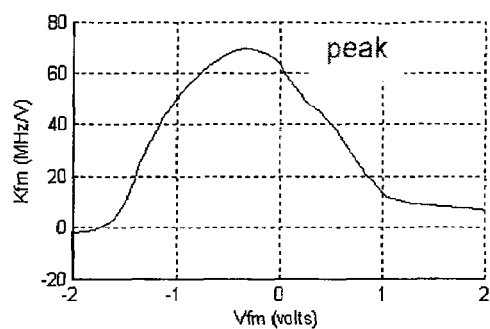

FIG. 13c shows a graph that illustrates the derivative of the frequency shift illustrated in FIG. 13b. The derivative, which is equivalent to the VCO sensitivity $K_{FM}$, reveals two problems. First, the peak sensitivity lies off center. This is because $C_{mid}$ does not lie midway between $C_{min}/2$ and $C_{max}/2$. It actually lies closer to $C_{max}/2$. This introduces asymmetry in the curve and potentially leads to a phase error that grows over time. Second, the sensitivity decreases as the modulation signal $v_{FM}$ increases. This is caused by the shaping of the cosine function in the $C_{ave}$ formula. The result is distortion, some of which is corrected by the PLL feedback loop. (The PLL tracks phase/frequency errors within its loop bandwidth and the accuracy of the $\Delta\Sigma$ modulator's control of the feedback counter.)

The nonlinear effects of the VCO limit the usefulness of direct phase/frequency modulation architectures. This is especially true for wideband modulation systems such as WCDMA. This system is based on direct sequence spread spectrum and QPSK modulation at 3.84 Mcps. Simulations of a direct modulation architecture (with 100 kHz loop bandwidth and VCO sensitivity of 70 MHz/V) show inadequate performance. The spectrum regrowth (adjacent channel level rejection—ACLR) measures approximately –56 dBc/1 MHz at 8.5 MHz offset while the error vector magnitude (EVM) approaches to 14%.

Figure 14:
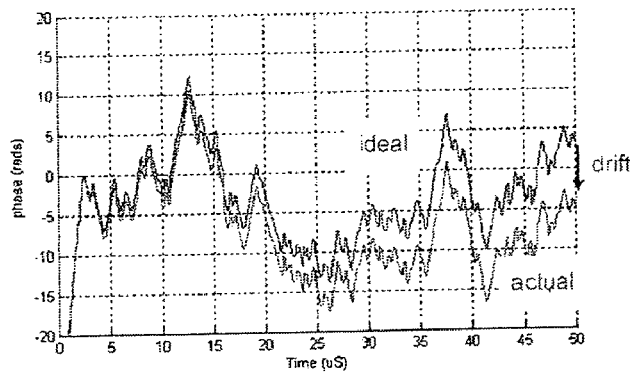
FIG. 14 shows a graph that illustrates the phase drift caused by a conventional VCO.

FIG. 14 shows a graph that illustrates the phase drift caused by a conventional VCO. As can be seen, the phase drifts due to frequency errors.

Figure 15:
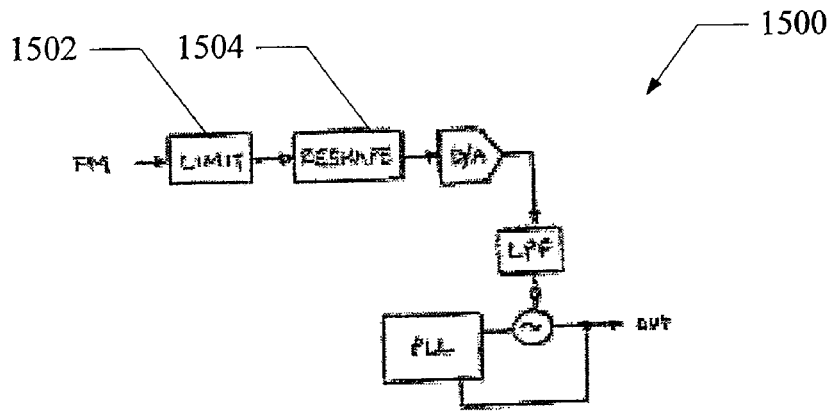
FIG. 15 shows one embodiment of a direct frequency/phase modulator for linear, wideband operation.

FIG. 15 shows one embodiment of a direct frequency/ phase modulator 1500 for linear, wideband operation. The modulator 1500 dramatically improves the performance of the direct modulation architecture by limiting and reshaping a modulation signal applied to the VCO. It includes a digital limiter 1502 and a linearizer (reshaper) 1504. Together, they focus the VCO operation to its linear region.

Figure 16:
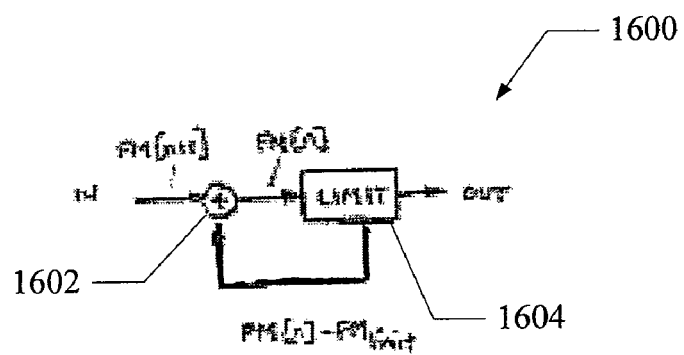
FIG. 16 shows one embodiment of a digital limiting circuit.

FIG. 16 shows one embodiment of a digital limiting circuit 1600. For example, the digital limiting circuit 1600 is suitable for use as the digital limiter 1502 shown in FIG. 15. The digital limiting circuit 1600 comprises summing logic 1602 and limit logic 1604. The digital limiting circuit 1600 digitally limits the range of the modulation signal $v_{FM}$ and directs any excess to the next sample according to the following;

$$FM[n+1] \to FM[n+1] + (FM[n] - FM_{limit})$$

where FM[n] describes the nth digital sample of signal $v_{FM}$, and $FM_{limit}$ corresponds to the digital limit (equal to about 15-20 MHz for WCDMA modulation). The excess FM is tracked to minimize phase drift.

Figure 17:
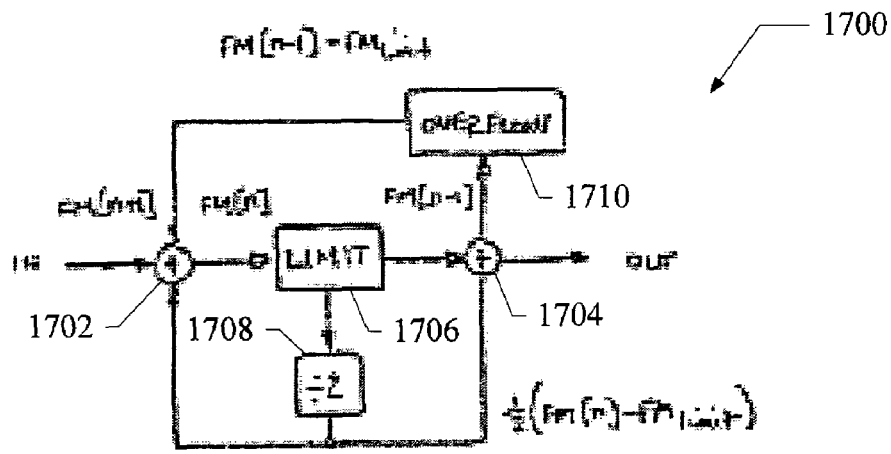
FIG. 17 shows one embodiment of an alternative digital limiting circuit.

FIG. 17 shows one embodiment of an alternative digital limiting circuit 1700. For example, the alternative digital limiting circuit 1700 is also suitable for use as the digital limiter 1502 shown in FIG. 15. The digital limiting circuit 1700 comprises summing logic 1702 and 1704, limit logic 1706, divide logic 1708, and overflow logic 1710. The digital limiting circuit 1700 uses a pipeline structure to add half the excess to both the previous sample (up to the limit) and the next sample according to the following;

$$FM[n-1] \to FM[n-1] + \frac{1}{2}(FM[n] - FM_{limit}) \text{ up to } FM_{limit}$$

$$FM[n+1] \to FM[n+1] + \frac{1}{2}\{FM[n] - FM_{limit}) + (FM[n-1] - FM_{limit})$$

Figure 18:
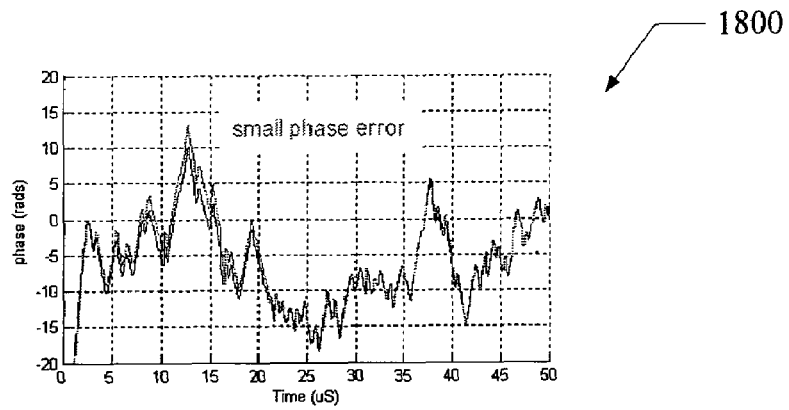
FIG. 18 shows a graph that illustrates the phase tracking behavior of one embodiment of a direct frequency/phase modulator with FM limiting.

FIG. 18 shows a graph 1800 that illustrates the phase tracking behavior of one embodiment of a direct frequency/phase modulator with FM limiting. As can be seen in the graph 1800, the algorithm spreads out the instantaneous frequency error and provides better phase tracking.

Figure 19:
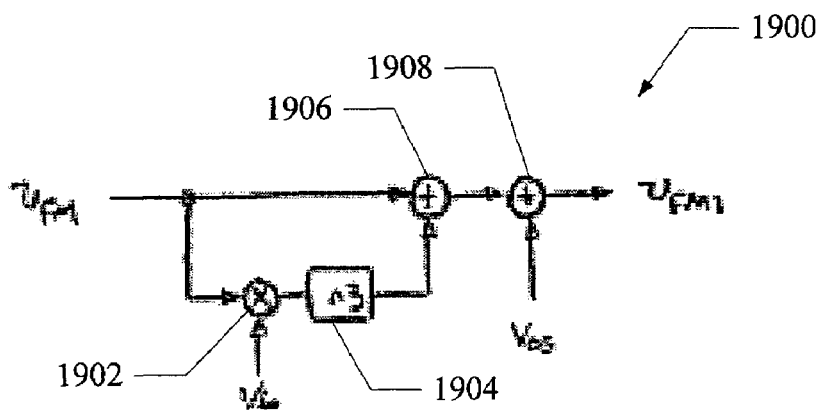
FIG. 19 shows one embodiment of a linearizer circuit that reshapes a FM signal and thereby dramatically improves the linearity of a VCO.

FIG. 19 shows one embodiment of a linearizer circuit 1900 that reshapes the FM signal and thereby dramatically improves the linearity of a VCO. For example, the linearizer circuit 1900 is suitable for use as the linearizer (reshaper) 1504 shown in FIG. 15. The linearizer circuit 1900 comprises multiply logic 1902, summing logic 1906 and 1908, and logic 1904. The linearizer circuit 1900 expands the modulation signal $v_{FM}$ to compensate for the cosine effect in the $C_{ave}$ integrand and introduces an offset $V_{os}$ to center the peak frequency deviation (VCO sensitivity $K_{FM}$). The cosine effect is corrected by scaling the modulation voltage $v_{FM}$ according to the following expression;

$$v_{FM1} = A \cos^{-1}\left(\frac{v_{FM}}{A}\right) \approx \left(\frac{v_{FM}}{A}\right) + \frac{1}{6}\left(\frac{v_{FM}}{A}\right)^3$$

where the approximation is valid for $v_{FM} \leq A/2$. The linearization can be accomplished using any suitable analog and/or digital circuits.

Figure 20A:
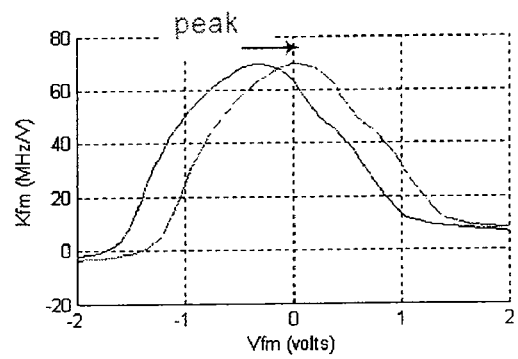
FIGS. 20a-b show graphs that illustrate improved linearity of a VCO using one embodiment of a linearizer circuit.
Figure 20B:
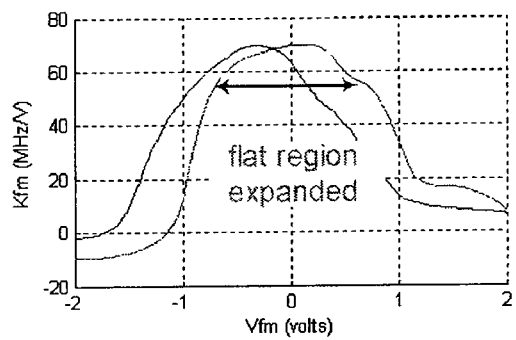

FIGS. 20a-b show graphs that illustrate improved linearity of a VCO using one embodiment of a linearizer circuit. FIG. 20a illustrates the improvement seen when an offset level $V_{os}$ is added to the modulation signal $v_{FM}$. FIG. 20b shows the further improvement that is possible when modulation signal expansion is added.

Figure 21:
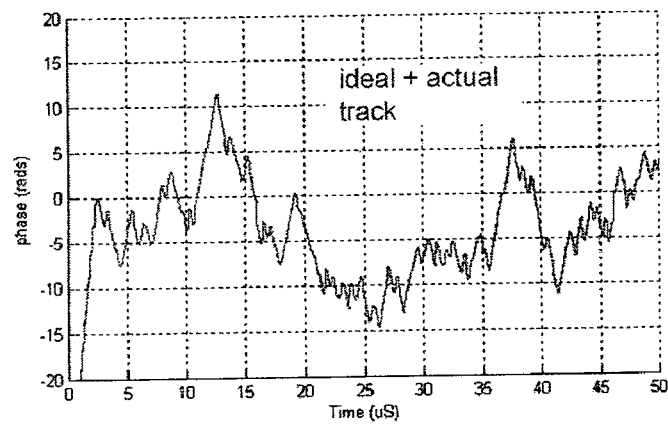
FIG. 21 shows a graph that illustrates the phase tracking behavior of one embodiment of a direct frequency/phase modulator comprising embodiments of an FM limiter and a linearizer.

FIG. 21 shows a graph that illustrates the phase tracking behavior of one embodiment of a direct frequency/phase modulator with the FM limiter and a linearizer. As can be seen, use of the FM limiter and linearizer leads to improved phase tracking.

In one or more embodiments, a phase modulation system is provided that comprises FM limiting and reshaping that dramatically improves the performance of the direct modulation architecture. As a result of the improved linearity, the ACLR falls below –62 dBc/1 MHz while the EVM to drops to about 2% for WCDMA systems. Thus, embodiments of the direct frequency/phase modulator may be used in a variety of wired or wireless devices to provide enhanced performance.

Figure 22:
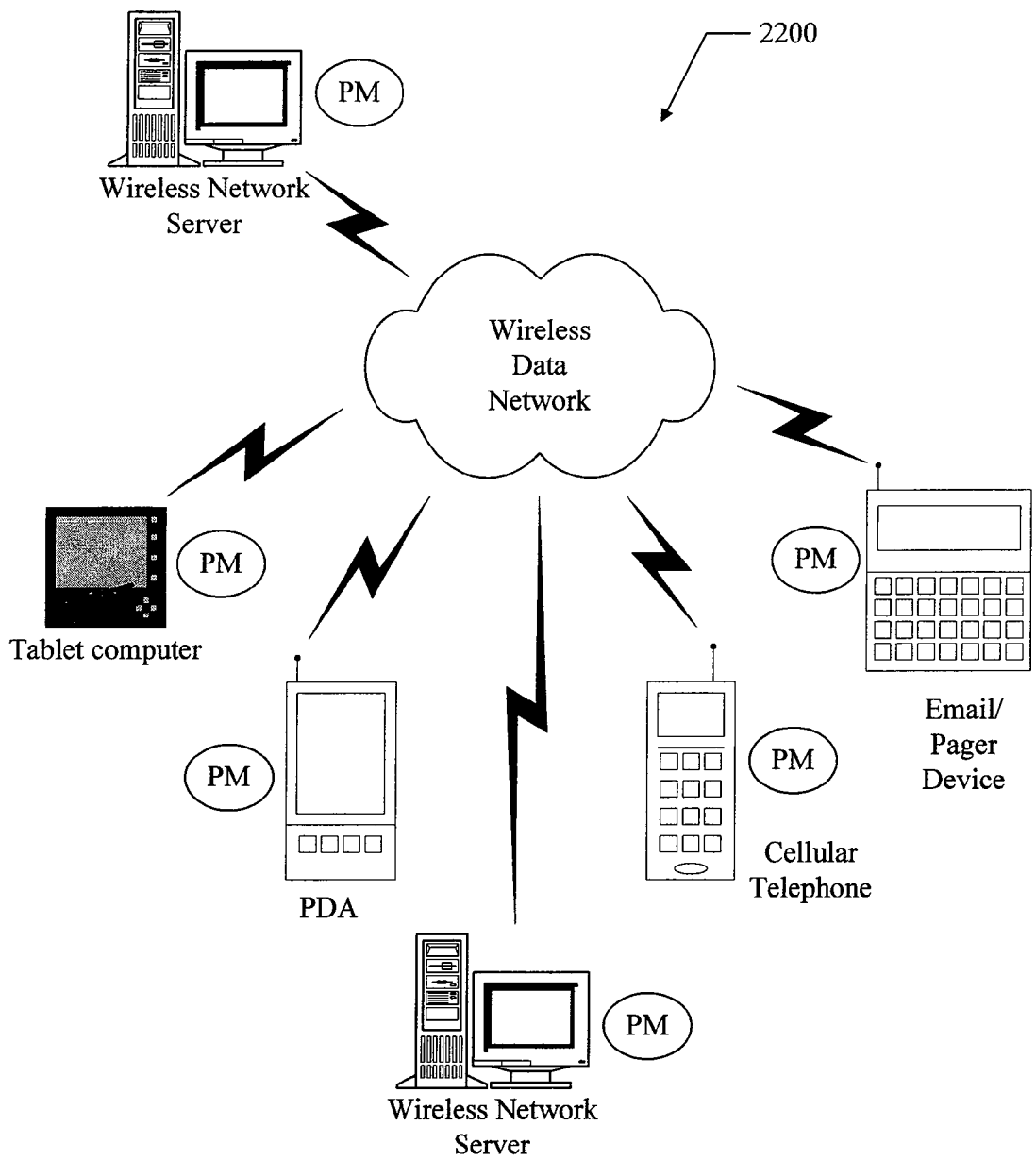
FIG. 22 shows a communication network that includes various communication devices that comprise embodiments of a highly-linear phase modulator.

FIG. 22 shows a communication network 2200 that includes various communication devices that comprise embodiments of a direct frequency/phase modulator (PM)

constructed in accordance with the present invention. The network 2200 includes multiple network servers, a tablet computer, a personal digital assistant (PDA), a cellular telephone, and an email/pager device all communicating over a wireless data network. It should be noted that embodiments of a direct frequency/phase modulator (PM) are suitable for use with virtually any device that utilizes phase modulation to operate on any type of communication network or system.

Accordingly, while embodiments of a phase modulation system have been illustrated and described herein, it will be appreciated that various changes can be made to the embodiments without departing from their spirit or essential characteristics. Therefore, the disclosures and descriptions herein are intended to be illustrative, but not limiting, of the scope of the invention, which is set forth in the following claims.

What is claimed is:

1. Apparatus for linear phase modulation utilizing a phase-locked loop, the apparatus comprising:
    a digital limiting circuit that restricts a range of a modulation signal that is coupled to a voltage controlled oscillator (VCO) associated with the phase-locked loop; and
    a linearizing circuit that reshapes the modulation signal to improve linearity;
    wherein the digital limiting circuit comprises a circuit disposed to:
    receive a set of digital samples representative of the FM value of the modulation signal;
    determine if the value of a first sample of the set of digital samples exceeds a predefined threshold; and
    responsive to said determining, adjust the values of the first sample and a second sample of the set of digital samples.

2. The Apparatus of claim 1 wherein the adjusting comprises:
    determining an excess of the value of the first sample above the predefined threshold;
    subtracting the excess from the first sample; and
    adding the excess to the second sample.

3. The Apparatus of claim 2 wherein the second sample represents a value of the modulation signal that is temporally successive to the value of the first sample.

4. The Apparatus of claim 2 wherein the second sample represents a value of the modulation signal that is temporally previous to the value of the first sample.

5. The Apparatus of claim 3 wherein the digital limiting circuit is further disposed to adjust, responsive to said determining, the value of a third sample of the set of digital samples, the third sample representing a value of the modulation signal that is temporally successive to the value of the first sample.

6. Apparatus for linear phase modulation utilizing a phase-locked loop, the apparatus comprising:
    a limiting circuit that restricts a range of a modulation signal that is coupled to an input of a voltage controlled oscillator (VCO) associated with the phase-locked loop; and
    a linearizing circuit that reshapes the modulation signal to improve linearity;
    wherein the linearizing circuit is disposed to predistort the modulation signal in accordance with a polynomial predistortion characteristic, said polynomial predistortion characteristic selected to offset a VCO non-linearity.

7. The Apparatus of claim 6 wherein the polynomial predistortion characteristic is a third order or higher order polynomial characteristic.

8. The Apparatus of claim 6 wherein the linearizing circuit further comprises an offset circuit disposed to center the peak frequency deviation of the modulation signal.

9. The Apparatus of claim 8 wherein the peak frequency deviation is centered by introducing an offset to said modulation signal.

10. The Apparatus of claim 6 wherein the linearization circuit is a digital circuit.

11. A method for providing linear phase modulation utilizing a phase-locked loop having a voltage controlled oscillator, the method comprising:
    limiting a range of a modulation signal that is coupled to the VCO; and
    linearizing the modulation signal input to improve linearity;
    wherein the limiting comprises:
    receiving a set of digital samples representative of the FM value of the modulation signal;
    determining if the value of a first sample of the set of digital samples exceeds a predefined threshold; and
    responsive to said determining, adjusting the values of the first sample and a second sample of the set of digital samples.

12. The Method of claim 11 wherein the adjusting comprises:
    determining an excess of the value of the first sample above the predefined threshold;
    subtracting the excess from the first sample; and
    adding the excess to the second sample.

13. The Method of claim 12 wherein the second sample represents a value of the modulation signal that is temporally successive to the value of the first sample.

14. The Method of claim 12 wherein the second sample represents a value of the modulation signal that is temporally previous to the value of the first sample.

15. The Method of claim 14 further comprising adjusting, responsive to said determining, the value of a third sample of the set of digital samples, the third sample representing a value of the modulation signal that is temporally successive to the value of the first sample.

16. A method for providing linear phase modulation utilizing a phase-locked loop having a voltage controlled oscillator (VCO), the method comprising:
    limiting a range of a modulation signal that is coupled to an input of the VCO; and
    linearizing the modulation signal input to improve linearity;
    wherein the linearizing comprises predistorting the modulation signal in accordance with a polynomial predistortion characteristic, said polynomial predistortion characteristic selected to offset a VCO non-linearity.

17. The Method of claim 16 wherein the polynomial predistortion characteristic is a third order or higher order polynomial characteristic.

18. The Method of claim 17 further comprising centering the peak frequency deviation of the modulation signal.

19. The Method of claim 18 wherein the centering comprises adding an offset value to the modulation signal.

20. A communication device comprising:
    a phase-locked loop circuit including a voltage controlled oscillator (VCO); and
    a compensation circuit for compensating for non-linearities in the VCO, said compensation circuit comprising:
    a digital limiter circuit for restricting the FM range of a modulation signal coupled to the VCO, said limiter circuit disposed to receive a set of digital samples representative of the FM value of the modulation signal, determine if the value of a first sample of the set of digital samples exceeds a predefined threshold, and, responsive to said determining, adjust the values of the first sample and a second sample of the set of digital samples; and a linearization circuit disposed to predistort the set of digital samples representative of the FM value of the modulation signal in accordance with a polynomial predistortion characteristic, said polynomial predistortion characteristic selected to offset a VCO non-linearity.

21. The Device of claim 20 wherein the digital limiter circuit is disposed to adjust the value of the first sample and second sample by:

determining an excess of the value of the first sample above the predefined threshold;

subtracting the excess from the first sample; and adding the excess to the second sample.

22. The Device of claim 21 wherein the second sample represents a value of the modulation signal that is temporally successive to the value of the first sample.

23. The Device of claim 21 wherein the second sample represents a value of the modulation signal that is temporally previous to the value of the first sample.

24. The Device of claim 22 wherein the digital limiting circuit is further disposed to adjust, responsive to said determining, the value of a third sample of the set of digital samples, the third sample representing a value of the modulation signal that is temporally successive to the value of the first sample.

25. A communication device comprising:

A phase-locked loop circuit including a voltage controlled oscillator; and

A compensation circuit for compensating for non-linearities in the VCO, said compensating circuit comprising:

a limiting circuit that restricts a range of a modulation signal that is coupled to an input of a voltage controlled oscillator (VCO) associated with the phase-locked loop; and a linearizing circuit that reshapes the modulation signal to improve linearity;

wherein the linearizing circuit is disposed to predistort the modulation signal in accordance with a polynomial predistortion characteristic, said polynomial predistortion characteristic selected to offset a VCO non-linearity.

26. The Device of claim 25 wherein the polynomial predistortion characteristic is a third order or higher order polynomial characteristic.

27. The Device of claim 25 wherein the linearizing circuit further comprises an offset circuit disposed to center the peak frequency deviation of the modulation signal.

28. The Device of claim 27 wherein the peak frequency deviation is centered by introducing an offset to said modulation signal.

29. The Device of claim 27 wherein the linearization circuit is a digital circuit.

* * * * *